(12) United States Patent
Yoshioka et al.

(10) Patent No.: US 6,756,615 B2
(45) Date of Patent: Jun. 29, 2004

(54) HETEROJUNCTION BIPOLAR TRANSISTOR AND ITS MANUFACTURING METHOD

(75) Inventors: Akira Yoshioka, Kanagawa (JP); Tetsuro Nozu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/407,428

(22) Filed: Apr. 7, 2003

(65) Prior Publication Data

US 2003/0213973 A1 Nov. 20, 2003

(30) Foreign Application Priority Data

Apr. 5, 2002 (JP) ........................................ 2002-103370

(51) Int. Cl.[7] ................ H01L 31/0328; H01L 31/0336; H01L 31/072; H01L 31/109
(52) U.S. Cl. ........................ 257/198; 257/197; 257/201
(58) Field of Search ................................. 257/197, 198, 257/201

(56) References Cited

U.S. PATENT DOCUMENTS

| | | | | |
|---|---|---|---|---|
| 5,298,763 A | * | 3/1994 | Shen et al. | 257/22 |
| 6,410,945 B1 | * | 6/2002 | Shiota et al. | 257/191 |
| 6,600,178 B1 | * | 7/2003 | Washio et al. | 257/197 |

FOREIGN PATENT DOCUMENTS

JP  2001-176881  6/2001

OTHER PUBLICATIONS

Q. J. Hartmann, et al. "Effect of Collector Design on the D.C. Characteristics of $In_{0.49}Ga_{0.51}P/GaAs$ Heterojunction Bipolar Transistors," Solid State Electronics, vol. 38, No. 12, 1995, pp. 2017–2021.
C. R. Bolognesi, et al. "InP/GaAsSb/InP Double Heterojunction Bipolar Transistors (Invited)," 2002 IEEE GaAs Digest, 2002, pp. 265–268.

* cited by examiner

*Primary Examiner*—Ngân V. Ngô
(74) *Attorney, Agent, or Firm*—Oblon, Spivak, McClelland, Maier & Neustadt, P.C.

(57) ABSTRACT

A heterojunction bipolar transistor comprises, an emitter made of a first compound semiconductor of a first conductivity type; a base made of a second compound semiconductor of a second conductivity type and having a bandgap smaller than the first compound semiconductor; and a collector made of a third compound semiconductor of a first conductivity type and having a bandgap wider than the second compound semiconductor. The emitter and the base form a heterojunction of type I. The base and the collector form a heterojunction of type II. Further, the base includes impurities by a concentration equal to or more than $5 \times 10^{19}$ $cm^{-3}$.

14 Claims, 11 Drawing Sheets

HETEROJUNCTION BIPOLAR TRANSISTOR AND ITS MANUFACTURING METHOD

CROSS-REFERENCE TO RELATED APPLICATIONS

This application is based upon and claims the benefit of priority from the prior Japanese Patent Application No. 2002-103370, filed on Apr. 5, 2002; the entire contents of which are incorporated herein by reference.

BACKGROUND OF THE INVENTION

The present invention relates to a heterojunction bipolar transistor and its manufacturing method, and more particularly, it relates to a heterojunction bipolar transistor being capable of a high-speed operation and having a high breakdown voltage and a high current gain and a method of manufacturing it.

In recent years, revolutionary development has accomplished in information technology including the Internet. For this reason, further improvement in the speed and capacity of wireless communications, such as an optical fiber communications system which makes that basis, and a cellular phone which makes that circumference, are required.

A transistor which is capable of high-speed operation is a key device of these high-speed communications. These transistors are made using semiconductors, such as Si (silicon) and GaAs (gallium arsenide). In a field for which more high-speed operation is needed, SiGe (silicon germanium), InP (indium phosphorus), etc. are capturing the spotlight as a next-generation material.

Further, high-power output is also needed for a device used for these optical communications and wireless communications besides high-speed operation. For this reason, improvement in resisting voltage of a transistor is also required. "A double heterojunction bipolar transistor (DHBT)" in which an emitter and a collector has a wider bandgap compared with a base is a hopeful transistor which fills this demand.

In the conventional general (single) heterojunction bipolar transistor (SHBT), base-collectors junction is a homojunction. That is, material with a comparatively small bandgap is used for the collector like the base. For this reason, in order to attain a high-breakdown voltage, it is necessary to make a collector thick enough. On the other hand, in DHBT, material with a wide bandgap is used not only for the emitter but for the collector. For this reason, thickness of the collector can be made thinner than SHBT. As the result, since electron transit time can be shortened, operation becomes possible at higher speed and a higher breakdown voltage.

By the way, it is known that there are two kinds of junction forms called "Type I" and "Type II" in a heterojunction. The "Type I" and "Type II" defined in this specification will be explained hereafter.

FIG. 12 is a band diagram showing a heterojunction of Type I. That is, this figure schematically shows a band structure of a heterojunction in an equilibrium state of two kinds of different semiconductors 12 and 14. Here, Ec shows a lower end of a conduction band, Ev shows energy of an upper end of a valence band, and Evac shows energy of a vacuum level as a standard of energy. Ec of the semiconductor 12 is located more closely to Evac than Ec of the semiconductor 14. Further, Ev of the semiconductor 12 is located remoter from Evac than Ev of the semiconductor 14. Such a heterojunction shall be called a heterojunction of "Type I" in this specification.

On the other hand, FIG. 13 is a band diagram showing a heterojunction of Type II. In this case, Ec of the semiconductor 22 is located remoter from Evac than Ec of the semiconductor 24.

Further, Ev of a semiconductor 22 is also located remoter from Evac than Ev of the semiconductor 24. Such a heterojunction shall be called a heterojunction of "Type II" in this specification.

FIG. 14 is a band diagram of a principal part of DHBT that has been embodied for a trial by the Inventors of the present invention in the course of attempting to make the invention complete. That is, this diagram shows the state where Emitter E, Base B, and Collector C are junctioned.

As shown to FIG. 14, in this DHBT, the base-collector heterojunction is of Type I shown in FIG. 12. As materials of the base and the collector, GaAs/InGaP, InGaAs/InP, etc. are used, for example. Thus, in the case of the DHBT which has the heterojunction of Type I in the base-collector interface, as typically shown in FIG. 14, potential barrier ΔEc exists between the collector and the base. Running of electrons is barred by this potential barrier and collector injection efficiency falls in a high current condition.

FIG. 15 is the so-called "gummel plot" showing the dependability of a collector current to the voltage VBE between the base and the emitter of the transistor. The curve B in this figure shows the characteristic of DHBT which has the band structure shown in FIG. 14. On the other hand, curve A shows the characteristic of a single-heterojunction bipolar transistor in which the same material is used for a collector and a base.

Since barrier ΔEc exists in the base-collector interface, it turns out that the collector current saturates at lower VBE in the curve B, than curve A. Thus, if the structure shown in FIG. 14 is used to obtain a high breakdown-voltage element, it is difficult to obtain a practically sufficient collector current. The outstanding performances, such as high-speed operation, high-level current gain, and high-level linearity can not fully able to be obtained.

As a means for avoiding this problem, it may be considered to connect the conduction bands of base and collector smoothly by making of the composition near the base-collector interface change gradually. Or by providing an intermediate layer containing high-concentration n-type impurities between base and collector, potential barrier width thereof may be decreased, and an electronic running may become easier by a tunneling effect.

However, in order to introduce such a composition inclination or an intermediate layer, it is necessary to perform a precise gas flow control when the semiconductor layer is grown by a Metal Organic Chemical Vapor Deposition (MOCVD) etc.

Consequently, a big burden is placed in equipment and its operation, and it is inferior in respect of manufacturing efficiency.

Further, even if the intermediate layer for obtaining the tunneling effect is introduced, it is difficult to obtain a sufficient current density.

On the other hand, it is considered to use Type II which is shown in FIG. 13 instead of Type I.

FIG. 16 is a band diagram of DHBT formed by using a heterojunction of Type II. By using the heterojunction of Type II, as shown in FIG. 16, the potential barrier between the base B and the collector C is lost. For this reason, unlike the case where heterojunction of Type I is used, decline in collector injection efficiency is eliminated, and DHBT having high collector injection efficiency can be realized.

However, as a result of a detailed examination of the Inventors, it turned out that in DHBT which had the type II heterojunction for emitter-base junction and base-collector junctions, there were some problems explained below.

First, if a junction of Type II is used, while a band barrier between base and collector will be lost, conversely, a band barrier arises between emitter and base, and a saturation value of collector current falls. As the result, since current density per unit area of the transistor decreases, it becomes necessary to enlarge size of the transistor to some extent in order to secure an output level.

When junction of Type II is provided between emitter E and base B, there maybe a problem that mobility of electrons in the base region falls. That is, as a trend of high-speed element development in recent years, in order to obtain low base resistance, impurities are needed to be added in the material of Base B in a high concentration.

When forming DHBT, GaAsSb and InGaAs can be mentioned as a typical material system in which high-concentration impurity doping is possible. However, in these material systems, the alloy scattering effect is severe, and since electrons injected into the base from the emitter experience remarkable scattering, mobility becomes extremely low.

For example, mobility of an electron in a material system mentioned above may fall to ⅕ of GaAs or less. As a result, a sufficient collector current may not be obtained at a predetermined voltage, and an operation speed may fall. That is, since electrons are injected into the base in the state near an equilibrium state when junction of Type II is provided between emitter E and base B, the problems may arise in response to such a scattering process.

Further, problems that collector injection efficiency may fall remarkably and current gain may become very low may arise, since the Auger recombination effect arising from high-concentration impurities is severe in these material systems.

Further, when using GaAsSb, selectivity over HCl which is the general etchant of InP is inferior to InGaAs. For this reason, there is also a problem that a reproducible process cannot be performed easily.

As explained above, it was difficult to obtain the transistor which has high speed, high breakdown, and high current gain.

SUMMARY OF THE INVENTION

According to an embodiment of the invention, there is provided a heterojunction bipolar transistor comprising, an emitter made of a first compound semiconductor of a first conductivity type; a base made of a second compound semiconductor of a second conductivity type and having a bandgap smaller than the first compound semiconductor; and a collector made of a third compound semiconductor of a first conductivity type and having a bandgap wider than the second compound semiconductor, the emitter and the base forming a heterojunction of type I, the base and the collector forming a heterojunction of type II, and the base including impurities by a concentration equal to or more than $5 \times 10^{19}$ cm$^{-3}$.

According to other embodiment of the invention, there is provided a heterojunction bipolar transistor comprising, an emitter made of a first compound semiconductor of a first conductivity type; a base made of a second compound semiconductor of a second conductivity type and having a bandgap smaller than the first compound semiconductor; and a collector made of a third compound semiconductor of a first conductivity type and having a bandgap wider than the second compound semiconductor, each of the first and third compound semiconductors includes a plurality of kinds of group III elements, and an orderliness of the plurality of kinds of group III elements in the third compound semiconductor is higher than an orderliness of the plurality of kinds of group III elements in the first compound semiconductor.

According to other embodiment of the invention, there is provided a heterojunction bipolar transistor comprising, an emitter made of a first compound semiconductor of a first conductivity type; a first base made of a second compound semiconductor of a second conductivity type and having a bandgap smaller than the first compound semiconductor; a second base made of a third compound semiconductor of a second conductivity type and having a bandgap smaller than the first compound semiconductor; and a collector made of a fourth compound semiconductor of a first conductivity type and having a bandgap wider than the third compound semiconductor, the third compound semiconductor having a composition that differs from a composition of the second compound semiconductor, the emitter and the first base forming a heterojunction of type I, and the second base and the collector forming a heterojunction of type II.

According to other embodiment of the invention, there is provided a manufacturing method of heterojunction bipolar transistor having: an emitter made of a first compound semiconductor of a first conductivity type; a base made of a second compound semiconductor of a second conductivity type and having a bandgap smaller than the first compound semiconductor; and a collector made of a third compound semiconductor of a first conductivity type and having a bandgap wider than the second compound semiconductor, the method comprising growing the third compound semiconductor at a higher temperature than a growth temperature of the first compound semiconductor.

According to the embodiment of the invention, while forming the heterojunction of Type I between emitter and base by using for a disordered material such as disordered InGaP for the emitter, and by using an ordered material such as ordered InGaP for the collector, the heterojunction of Type II can be formed between base and collector, and thus, the energy barrier in an interface can be vanished.

As a result, electrons are injected into the collector without being barred by a potential barrier ΔEc.

Furthermore, according to the hot electron effect of the electron injected from the emitter, the influence of Auger recombination or alloy scattering can be controlled, and thus, a high current gain can be obtained.

Moreover, the same effect is realized also by using a two-layered structure which consists of materials which are different in the base.

That is, according to the invention, the heterojunction bipolar transistor with which high current gain is obtained at high speed can be realized certainly and easily, and the merit on industry is great.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Hereafter, some embodiment of the invention will be explained, referring to drawings.

(First Embodiment)

As a first embodiment of the invention, a heterojunction bipolar transistor (HBT) where an ordered compound semiconductor is used for a collector will be explained. By using such an ordered compound semiconductor for the collector, a potential barrier between base and collector may be lost.

Figure 1A:
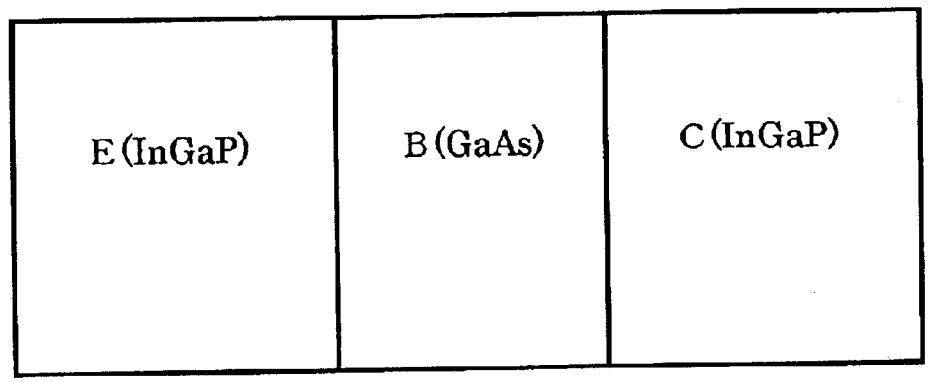
FIGS. 1A and 1B are conceptual diagrams showing the principal part of HBT of the embodiment.
Figure 1B:
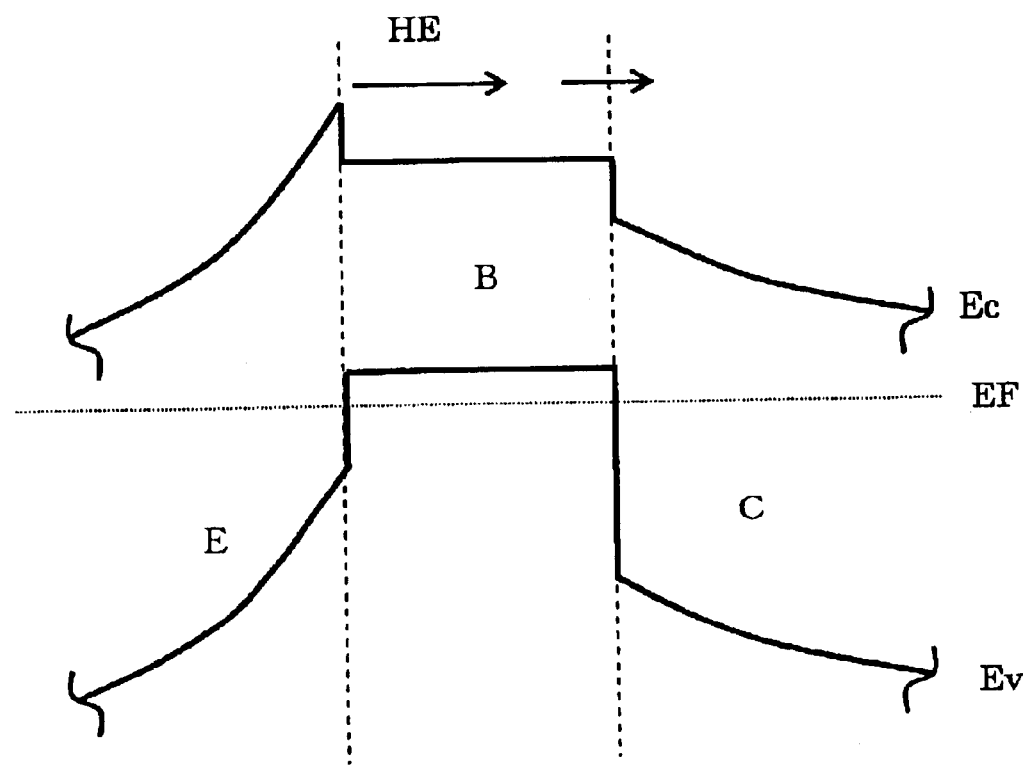

FIGS. 1A and 1B are conceptual diagrams showing the principal part of HBT of this embodiment. That is, FIG. 1A shows the junction part of HBT, and FIG. 1B shows the band structure thereof.

In this embodiment, emitter E is formed of a disordered compound semiconductor at least near the junction part of emitter E and base B. And in a junction part of base B and collector C, collector C is formed of an ordered compound semiconductor.

For example, disordered InGaP may be used for the emitter E, GaAs may be used for the base B, and ordered InGaP may be used for the collector C. Here, in an ordered InGaP, periodicity appears in the arrangement of the group III elements, and a structure in which InP and GaP are arranged almost periodically is formed.

Such an ordered compound can be obtained by adjusting parameters, such as a gas flow ratio and growth temperature, for example, in the metalorganic chemical vapor deposition (MOCVD) method, as will be explained in full detail later.

It should be noted that orderliness and disorderliness do not necessarily need to be perfect in the invention. That is, disordered compounds are not limited to the ones where group III elements are arranged completely at random. What is necessary is that a junction of Type I is formed between base B and emitter E. Therefore, it is also possible to use materials in which the ordered areas partially exist or materials which is in a partially ordered state.

Also, ordered compounds are not limited to the ones where group III elements are arranged completely periodically. What is necessary is that a junction of Type II is formed between base B and collector C. Therefore, the materials where arrangement of group III elements may have partial may be used.

Or, materials which consist of two or more domains each of which has periodic structure may also used.

The existence of such an "ordering" can be determined, for example, by a Photoluminescence (PL) measurement. This is a method as generally explained in the following:

That is, InGaP layer formed on a GaAs substrate is irradiated with an excitation light, and an emission spectrum of the emitted secondary light is measured. It can be determined that InGaP is in a nearly perfect disordered state, if energy (bandgap energy) of a peak is about 1.9 eV in this spectrum. And it can be determined that InGaP is in a nearly ordered state, if energy of a peak is about 1.85 eV in this spectrum. And it can be determined that InGaP is in a state where ordered areas exist partially, if energy of a peak is larger that 1.85 eV and smaller than 1.9 eV in the spectrum.

On the other hand, a determination of "Type I" or "Type II" can be carried out with various kinds of measuring methods which can detect a discontinuity of an energy band at a semiconductor heterojunction. For example, the C-V measuring method can be mentioned as a typical one of such measuring methods.

Figure 2:
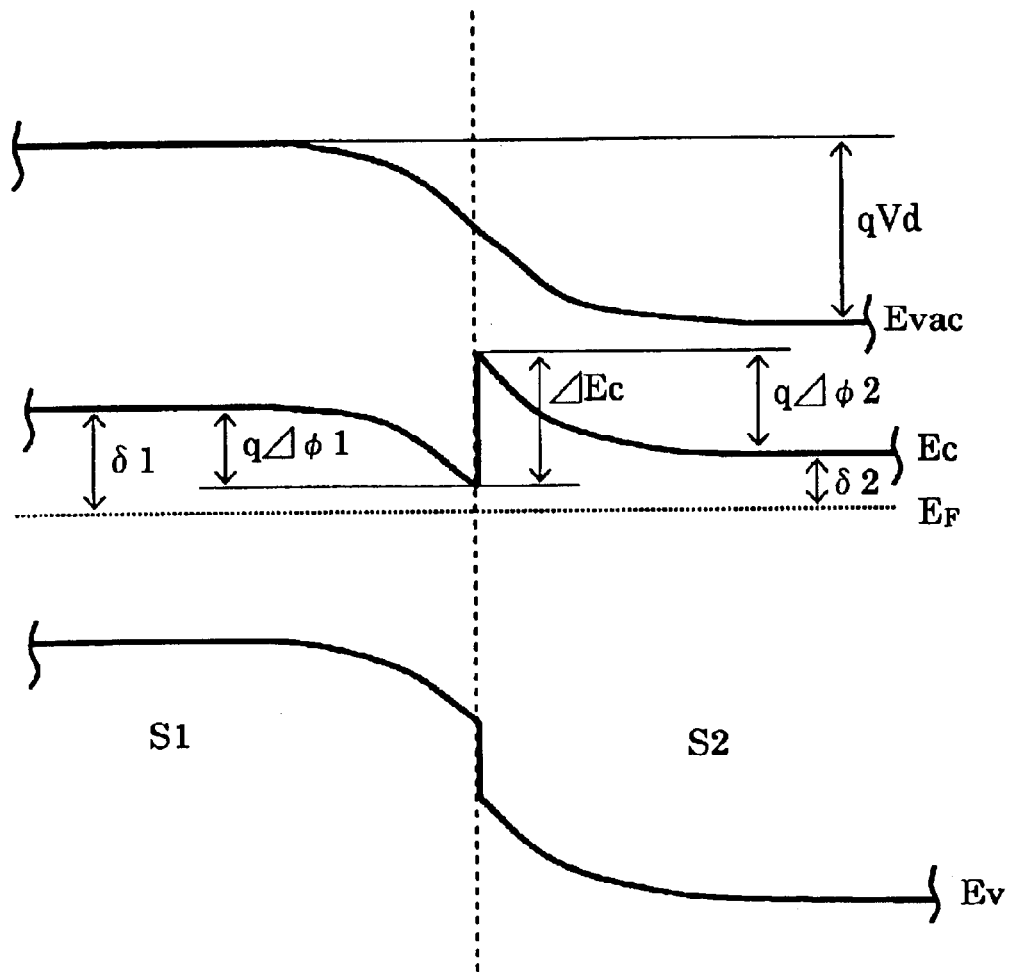
FIG. 2 shows a bandstructure at a hetero-interface.

FIG. 2 shows the energy band structure at a heterojunction interface. When measuring by the CV method, Schottky junction or p-n junction is formed near the heterojunction, and reverse bias is applied. Then, a depletion layer is extended and junction capacity is generated. The diffusion potential Vd can be obtained by investigating relation between the impressed voltage and the capacity at this time. Apart from this, the doping concentration and a bandgap of semiconductors S1 and S2 are determined.

Then, difference $\Delta Ec$ of a conduction band Ec can be calculated from the following formula:

$$\Delta Ec = qVd - \delta 1 + \delta 2$$

Here, Vd is a diffusion potential and q is a charge. Further, $\delta 1$ and $\delta 2$ are the energy differences of the Fermi energy and the conduction band Ec in semiconductors S1 and S2, respectively.

This formula can be understood by referring to various physical parameters in a semiconductor heterojunction shown in FIG. 2.

Difference $\Delta Ev$ of valence-band energy can be calculated from the following formula by using difference $\Delta Eg$ of the band gap of semiconductors S1 and S2.

$$\Delta Ev = \Delta Eg - \Delta Ec$$

Thus, by calculating $\Delta Ec$ and $\Delta Eg$, it can be determined whether the junction is the heterojunction of "Type I" or the heterojunction of "Type II."

On the other hand, the same determination can also be performed, for example, by the PL (photoluminescence) method besides the CV method.

Figure 3:
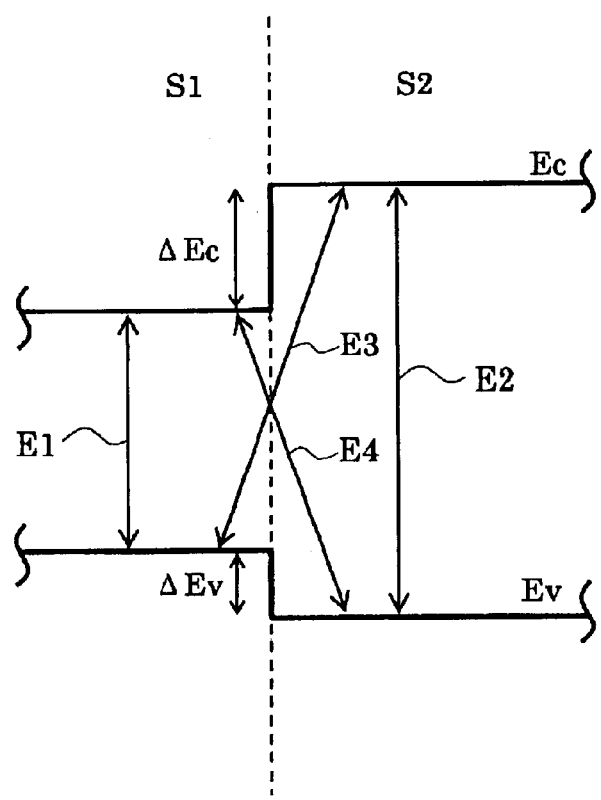
FIG. 3 is a schematic diagram which shows energy band structure in a semiconductor heterojunction.

FIG. 3 is a schematic diagram which shows energy band structure in a semiconductor heterojunction. That is, when a semiconductor S1 and a semiconductor S2 form a heterojunction, four kinds of transitions E1–E4 exist as the transition processes between these valence bands Ev and conduction bands Ec. The energies of the transitions E1–E4 can be determined by irradiating excitation light at the heterojunction and by measuring the spectrum of the secondary light obtained. Thus, from the acquired energy values, $\Delta Ec$ and $\Delta Eg$ can be calculated like the above, and the type of the heterojunction can be determined.

Returning to FIG. 1B to continue the explanation, in the embodiment, a heterojunction of Type II is provided between base and collector while proving a heterojunction of Type I between emitter and base. Therefore, an energy barrier in an interface of the base and the collector disappears.

Thus, even if a compound of the same composition is used, band structure of a heterojunction differs between the case where a disordered compound is used and the case where an ordered compound is used. This is considered because the band structure and energy levels of the compound changes by the ordering. As a reference which indicated change of band structure by ordering, Sverre Froyen et al., Appl. Phys. Lett., 68, p. 2852–2854, 1996 can be mentioned, for example.

When the band structure shown in FIG. 1B is formed, electrons pass through the base B from the side of the emitter E, while keeping a non-equilibrium state and a high kinetic energy.

Figure 16:
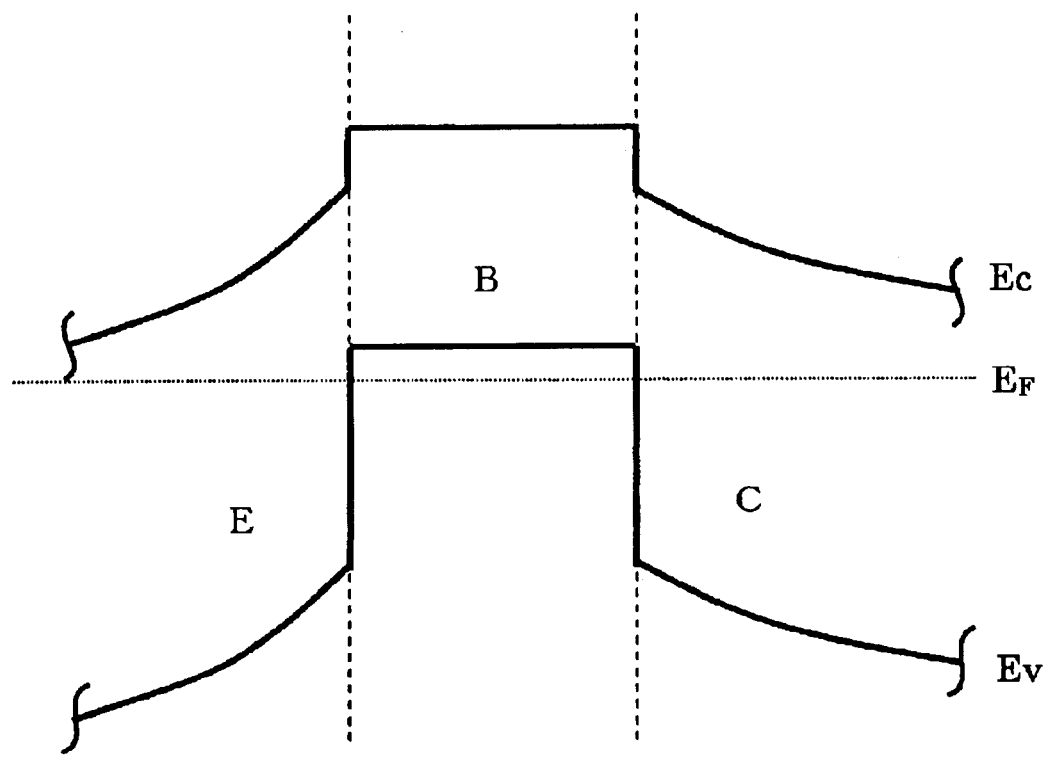
FIG. 16 is a band diagram of DHBT formed by using a heterojunction of Type II.

This is so-called "hot electron effect." In this situation, hot electrons HE reach to collector C, without experiencing many scattering. Therefore, base running time of the electrons is shortened compared with a case where there is no emitter barrier as shown in FIG. 16, and much more high-speed operation is attained. Further, since the heterojunction of type II is formed between the base and the collector, electrons are injected into the collector C, without being barred by a potential barrier $\Delta Ec$.

Figure 4:
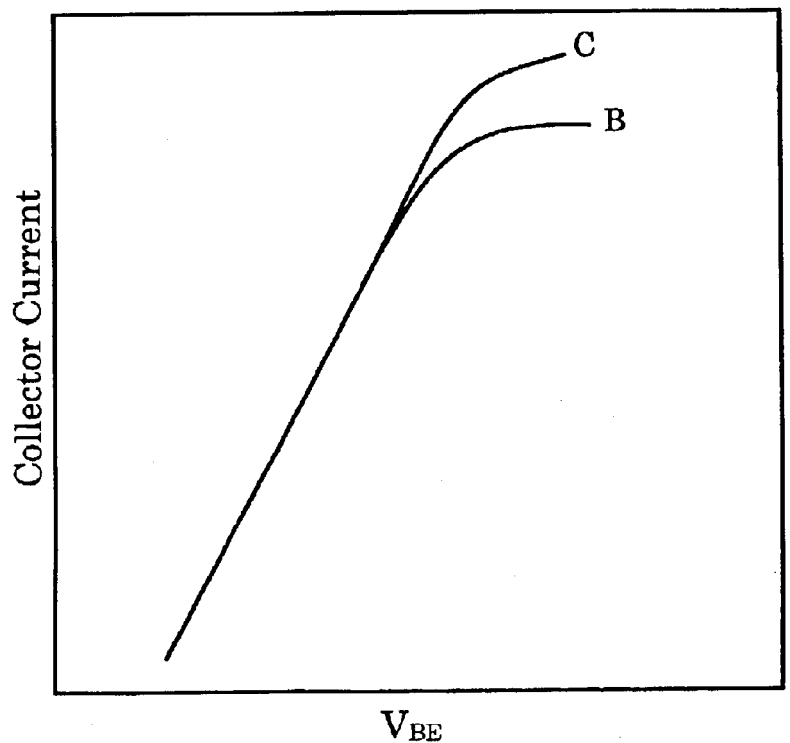
FIG. 4 is a gummel plot showing the dependency of collector current on the voltage VBE between base and emitter of a transistor.
Figure 15:
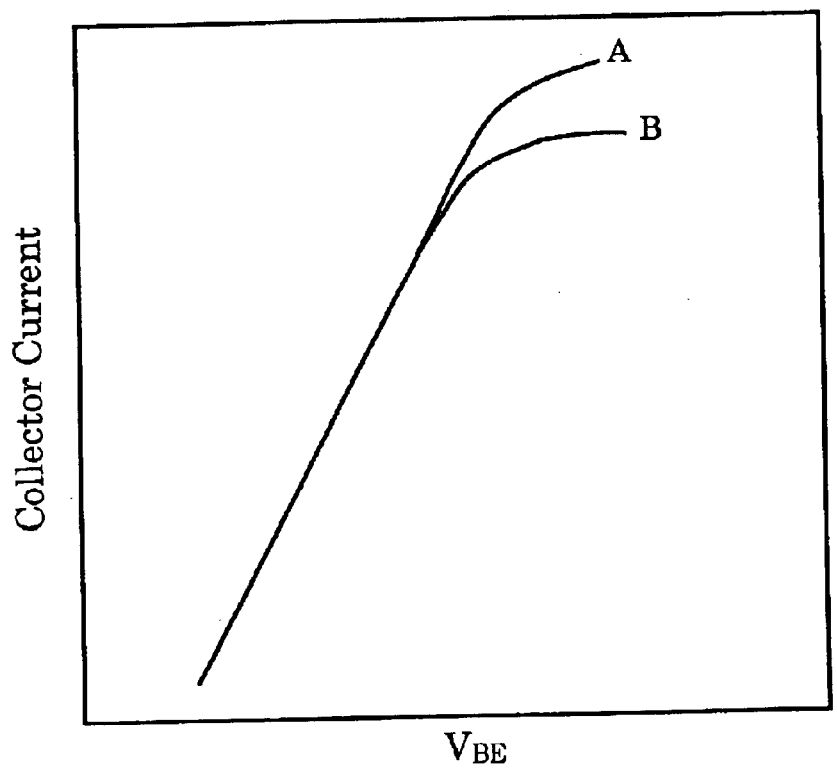
FIG. 15 is the so-called "gummel plot" showing the dependability of a collector current to the voltage VBE between the base and the emitter of the transistor.

FIG. 4 is a gummel plot showing the dependency of collector current on the voltage VBE between base and emitter of a transistor. Curve C in this figure shows the characteristic of DHBT of this embodiment. On the other hand, curve B in FIG. 4 shows the characteristic of a transistor where collector is formed by a disordered material and a band structure shown in FIG. 15 is formed.

As seen from FIG. 4, according to the invention, by forming a collector with an ordered compound, a potential barrier between base and collector can be canceled and the operating characteristic of a transistor can be improved.

On the other hand, as shown in FIG. 16, when base-emitter junction and base-collector junction are set as Type II, electrons run the inside of the base with an equilibrium state. Therefore, electrons experience excessive Auger recombination or alloy scattering all over a base. Consequently, current gain falls.

On the other hand, according to the embodiment, according to the hot electron effect of the electrons injected from emitter E, influence of Auger recombination or alloy scattering is controlled, and high current gain is obtained.

(Second Embodiment)

Next, as a second embodiment of the invention, a heterojunction bipolar transistor in which a potential barrier between base and collector is cancelled by making the base into two-layered structure will be explained.

Figure 5A:
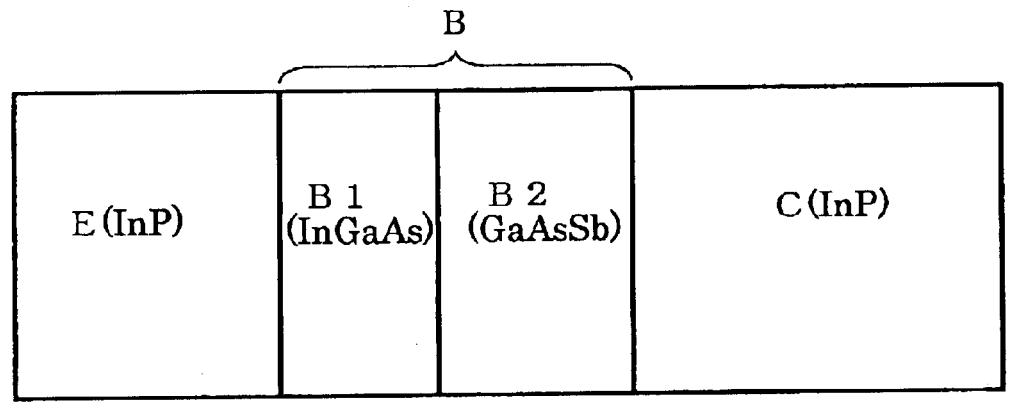
FIGS. 5A and 5B are conceptual diagrams showing the principal part of HBT of the embodiment.
Figure 5B:
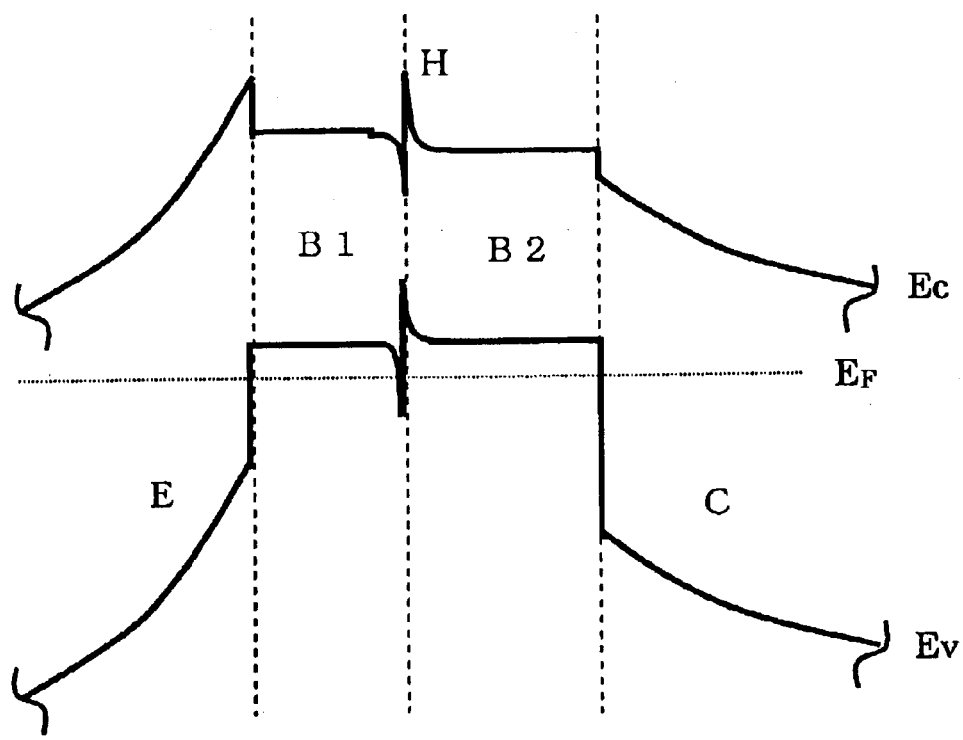

FIGS. 5A and 5B are conceptual diagrams showing the principal part of HBT of this embodiment. That is, FIG. 5A shows a junction part of HBT, and FIG. 5B shows the band structure.

In HBT shown in FIG. 5, both collector C and emitter E are formed by InP, and base B is formed with a first base B1 which consists of InGaAs, and a second base B2 which consists of GaAsSb. In this structure, since InP/InGaAs junction is formed at the emitter-base interface, it will turn into a hetero interface of Type I. Furthermore, since GaAsSb/InP junction is formed at the base-collector interface, it turns into a hetero interface of Type II.

Since InP which constitutes collector C is a semiconductor with a comparatively wide bandgap, it becomes possible to make the thickness of the collector C thin while keeping a high breakdown voltage. As this result, a transistor which has high speed, a high breakdown voltage, and a high current gain can be obtained.

In this embodiment, it is desirable to make the carrier concentrations of the first and second bases B1 and B2 high. The reason will be explained below.

In this embodiment, heterojunction H is formed in the base B. In such a heterojunction H, "discontinuity" exists in a conduction band and it may bar a motion of electrons. In response to this, if carrier concentration of the base B is made high, for example to more than $2 \times 10^{19}$ (cm$^{-3}$), a depletion layer is almost not formed and the width of the discontinuity of the conduction band can be narrowed as shown in FIG. 5B.

In this embodiment, electronic tunneling can be made remarkable by narrowing the width of "discontinuity" of a conductor by these measures. As the result, the electrons injected into the first base B1 with high energy from emitter E tunnel the "discontinuity" of heterojunction H, and is injected into the second base of GaAsSb without a loss, and thus, the operating characteristic of the transistor is not degraded.

EXAMPLES

Hereafter, the embodiment of the invention will be explained in more detail referring to examples.

First Example

First, an example of HBT according to the first embodiment of the invention will be explained as a first example of the invention.

Figure 6A:
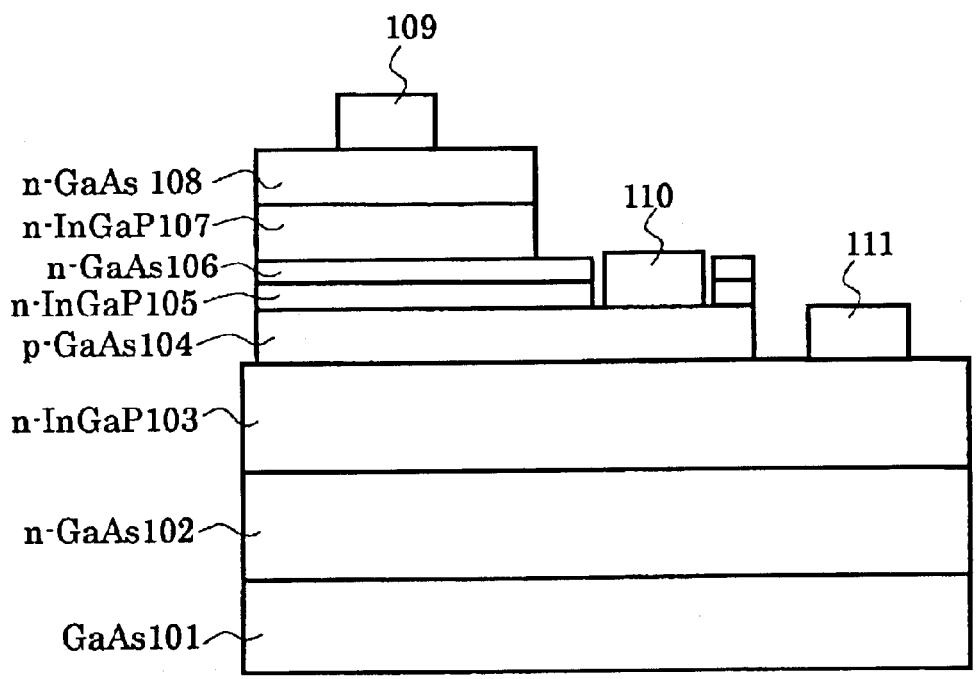
FIG. 6A is a schematic diagram showing principal part sectional structure of HBT of the example.

FIG. 6A is a schematic diagram showing principal part sectional structure of HBT of this example. That is, HBT of this example has a structure where the n-type GaAs sub-collector layer 102, the n-type InGaP collector layer 103, the p-type GaAs base layer 104, the n-type InGaP ledge layer 105, the n-type GaAs etching stopper layer 106, the n-type InGaP emitter layer 107, and the n-type GaAs emitter contact layer 108 are laminated in this order, on the GaAs substrate 101.

The part of the laminated structure is removed, the collector electrode 111 is connected to the collector layer 103, the base electrode 110 is connected to the base layer 104, and the emitter electrode 109 is connected to the emitter contact layer 108.

Hereafter, structure of HBT of this example will be explained still in more detail according to the manufacture procedure.

Crystal growth of the semiconductor layers can be performed for example, by the MOCVD method.

Figure 6B:
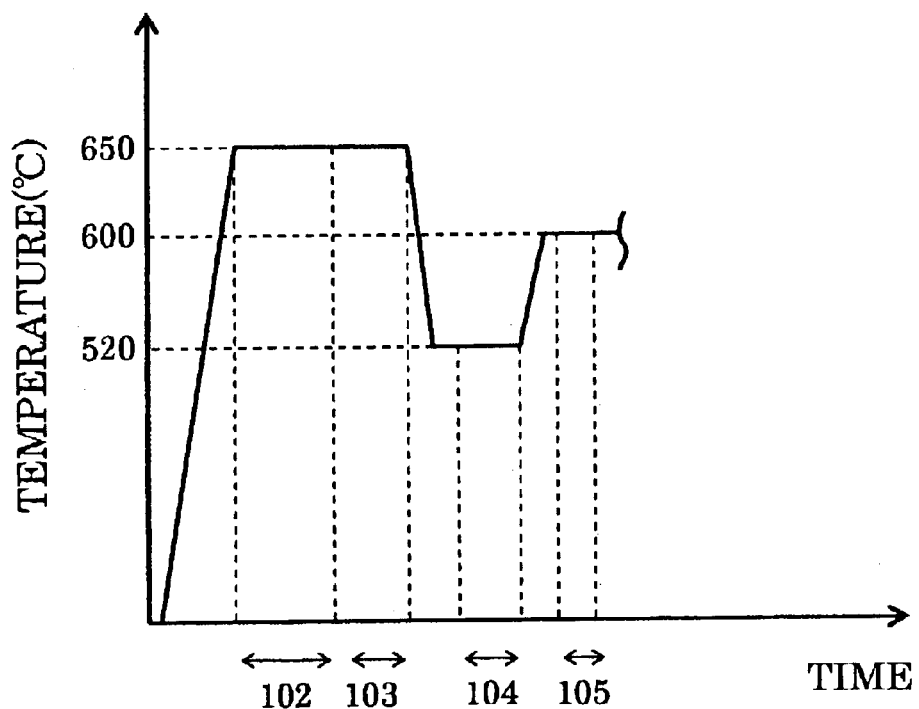
FIG. 6B is a graphical representation shown a part of the change in growth temperatures.

FIG. 6B is a graphical representation shown a part of the change in growth temperatures.

First, the gallium arsenide (GaAs) substrate 101 is introduced into a reaction furnace of a MOCVD growth apparatus. Then the temperature of the reaction furnace is raised up to 650 degrees centigrade, while flowing $AsH_3$ into the reaction furnace in order to prevent dissociation of arsenic (As) atoms from the substrate 101 by the heat. After temperature is stabilized, trimethylgallium (TMGa) and silane ($SiH_4$) are introduced in the reaction furnace, and the n-type GaAs sub-collector layer 102 is grown up to about 300 nm in thickness. $SiH_4$ flux was adjusted so that the concentration of Si (silicon) as the dopant may be set to $5 \times 10^{18}$ ($cm^{-3}$).

Phosphine ($PH_3$), TMGa, trimethylindium (TMIn), and $SiH_4$ are introduced in a furnace, and n type indium gallium phosphorus ($In_{0.48}Ga_{0.52}P$) electron collector layer 103 is grown up to be after an appropriate time at about 200 nm layer thickness. Si concentration in this layer adjusts $SiH_4$ flux so that it may be set to $3 \times 10^{16}$ ($cm^{-3}$). Here, the V/III ratio which is a flux Mol ratio of group V materials and group III materials was set to about 150.

After growing up the electron collector layer 103, the temperature of a reaction furnace is lowered to 520 degrees centigrade.

And after temperature is stabilized, $AsH_3$ and TMGa are introduced in a reaction furnace, and the p type GaAs base layer 104 is grown up to be about 30 nm layer thickness. At this time, a V/III ratio is adjusted so that the hole concentration in a p type GaAs layer may be set to $1 \times 10^{20}$ ($cm^{-3}$). It was referred to as V/III=0.3 in this example.

The temperature of a reaction furnace is raised to 600 degrees centigrade after growth of the base layer 104, $PH_3$, TMGa, TMIn, and $SiH_4$ are introduced in a furnace, and the n type $In_{0.48}Ga_{0.52}P$ ledge layer 105 is grown up to be about 20 nm layer thickness. At this time, $SiH_4$ flux is adjusted so that the concentration of Si (silicon) as the dopant may be set to $3 \times 10^{17}$ ($cm^{-3}$). A V/III ratio here was set to 150.

Then, the n-type GaAs etching stopper layer 106 of about 7 nm with Si concentration of $2 \times 10^{18}$ ($cm^{-3}$) was grown. Further, the n-type $In_{0.48}Ga_{0.52}P$ emitter layer 107 of about 50 nm with Si concentration of $3 \times 10^{17}$ ($cm^{-3}$) and the n-type GaAs emitter contact layer 108 of about 50 nm with Si concentration of $5 \times 10^{18}$ ($cm^{-3}$) were grown one by one, and the reaction furnace temperature was lowered to the room temperature, and the wafer was taken out from the reaction furnace.

The band lineup of emitter (ledge), base and collector formed in this way is the one shown in FIG. 1B. Namely, when growth temperature of n-type $In_{0.48}Ga_{0.52}P$ layer 103 used as a collector was set into 650 degrees centigrade and a V/III ratio was set to 150, grown-up InGaP turned into the ordered state where InP and GaP arranged almost periodically. As the result, a hetero-interface of the GaAs base layer 104 and the InGaP collector layer 103 turned into a hetero-interface of Type II.

In contrast, as for the n-type $In_{0.48}Ga_{0.52}P$ ledge layer 105 which acts as an emitter, a half-disordered state where arrangement of InP and GaP was comparatively disordered was formed by setting the the growth temperature at 600 degrees centigrade, and by setting the V/III ratio at 150. As this result, the GaAs base layer 104 and the InGaP ledge layer 105 (emitter) formed a hetero-interface of Type I.

Thus, in the MOCVD method, it is possible to adjust a degree of ordering of a compound suitably by adjusting growth conditions. And a transistor of this embodiment was realized by thus forming junction of Type I and junction of Type II.

Growth conditions for determining a degree of ordering of the compound can be suitably determined by peculiar conditions of each growth method and a growth apparatus. However, in general, in order to acquire ordered structure, it is desirable to set the growth conditions close to a thermal equilibrium state, by increasing the temperature, for example.

In a transistor of this example, for "discontinuity" of a conduction band between base and emitter, electrons injected into the base layer 104 from the emitter (ledge) layer 105 will be in a non-equilibrium state (hot electron state) within the base layer 104, and they reach to the collector layer 103 without experiencing many scattering.

On the other hand, since a heterojunction of Type II is formed between base and collector, electrons are injected in the collector layer 103, without being prevented by a potential barrier ΔEc.

If both interface between base and emitter and interface between base and collector are set as a junction of Type II as shown in FIG. 16, electrons run the inside of a base layer with an equilibrium state. Therefore, electrons experiences remarkable Auger recombination or alloy scattering in the base layer. This phenomenon becomes especially remarkable, when impurity concentration of the base layer is raised in order to lower the base resistance. As this result, current gain of the transistor would be restricted to at most about 15. On the other hand, with a transistor of this example, even if the hole concentration of the base layer is increased to $1 \times 10^{20}$ ($cm^{-3}$), electronic scattering can be controlled, and a high current gain of 25 can be obtained.

Thus, according to the invention, the remarkable effect is acquired when there is much scattering such as the case where impurity concentration of the base layer exceeds $5 \times 10^{19}$ ($cm^{-3}$), for example.

What is important in this example is that the emitter (ledge) InGaP layer is in a half-disordered or disordered state, a hetero-interface of the emitter (ledge) and the base forms junction of Type I, the InGaP collector layer is in an ordered state, and the hetero-interface of the base and the collector forms junction of Type II. Therefore, examples where growth conditions of collector and emitter (ledge) layer are chosen suitably are also included in the range of the invention as long as the above-mentioned conditions are fulfilled.

For example, examples where thickness of each layer is suitably changed, where material of a small bandgap like InGaAs is adopted as the emitter contact layer, where a etching stopper layer layer is added by request on a process, etc. are included in the range of the invention.

Second Example

Next, a second example of HBT according to the first embodiment of the invention will be explained as a second example of the invention.

Figure 7A:
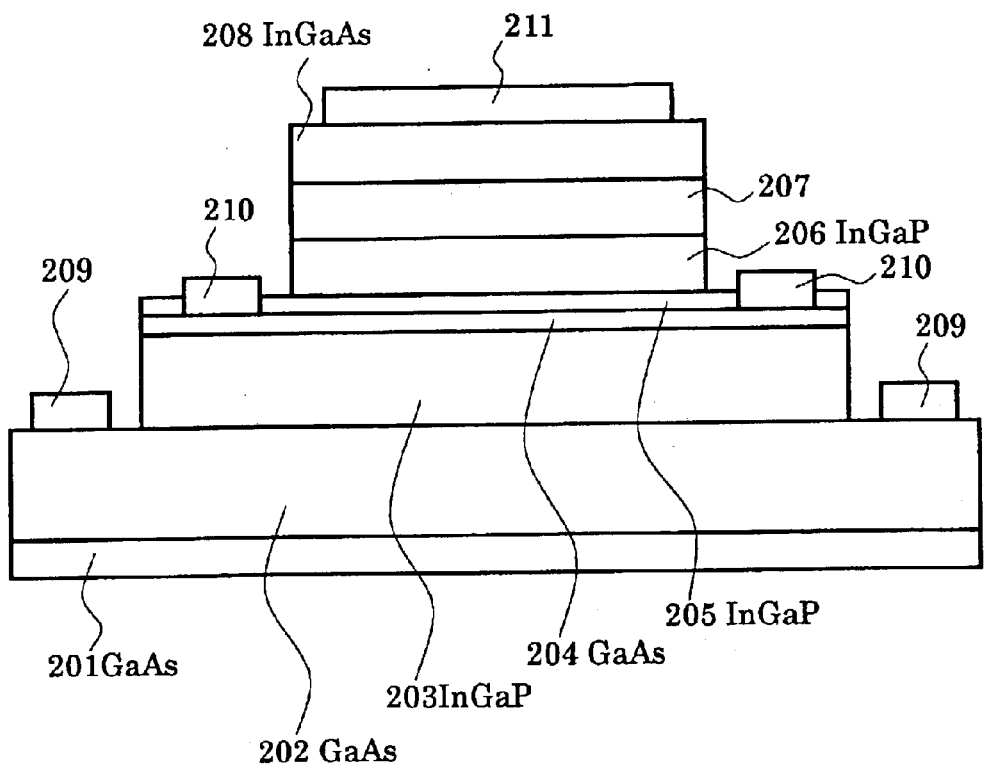
FIG. 7A is a schematic diagram showing principal part sectional structure of HBT of the example.

FIG. 7A is a schematic diagram showing principal part sectional structure of HBT of this example. That is, HBT of this example has a structure where the n-type GaAs collector contact layer 202, the n-type InGaP collector layer 203, the p-type GaAs base layer 204, the n-type InGaP ledge layer 205, the n-type InGaP emitter layer 206, the n-type GaAs intermediate layer 207, and the n-type GaAs emitter contact layer 208 are laminated in this order, on the GaAs substrate 201.

The part is removed, the collector electrode 209 is connected to the collector contact layer 202, the base electrode 210 is connected to the base layer 204, and the emitter electrode 211 is connected to the emitter contact layer 108.

Hereafter, structure of HBT of this example will be explained in more detail according to the manufacture procedure.

Also in this example, crystal growth of the semiconductor layers was performed by the MOCVD method.

Figure 7B:
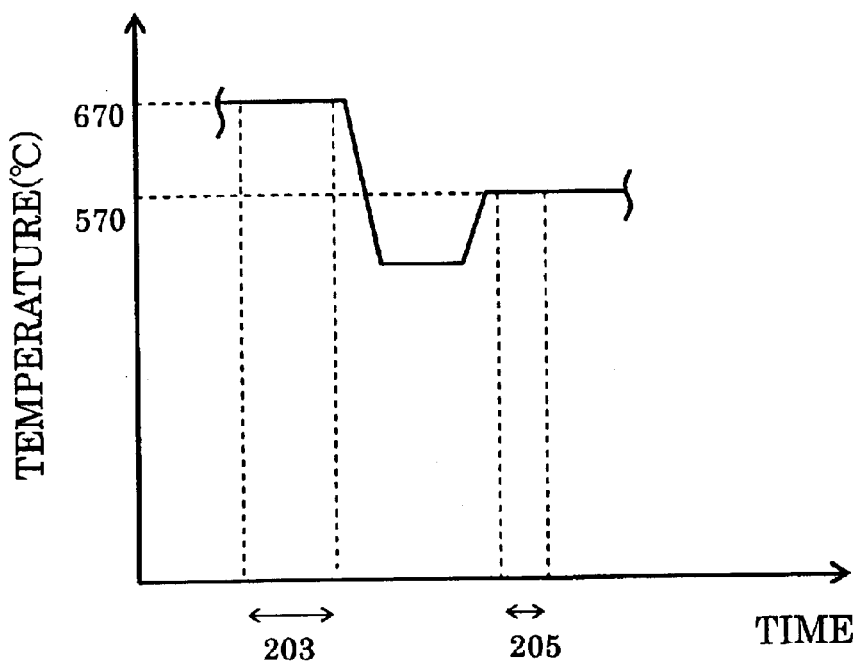
FIG. 7B is a graphical representation showing a part of the change in growth temperatures.

FIG. 7B is a graphical representation showing a part of the change in growth temperatures.

That is, the semi-insulating GaAs substrate 201 was introduced into a MOCVD growth furnace, and an n+-type GaAs collector contact layer ($5 \times 10^{18}$ cm$^{-3}$ of Si-doped, 500 nm of layer thickness) 202, the ordered n-type InGaP collector layer ($3 \times 10^{16}$ cm$^{-3}$ of Si-doped, 500 nm of layer thickness) 203, the p+-type GaAs base layer ($5 \times 10^{19}$ cm$^{-3}$ of C-doped, 50 nm of layer thickness) 204, a n-type InGaP emitter layer ($2 \times 10^{17}$ cm$^{-3}$ of Si-doped, 10 nm of layer thickness) 205, the n+-type GaAs layer ($5 \times 10^{18}$ cm$^{-3}$ of Si-doped, 50 nm of layer thickness) 207, and the n+-type InGaAs emitter contact layer ($3 \times 10^{19}$ cm$^{-3}$ of Te-doped, 50 nm of layer thickness) 208 were epitaxially grown in this order.

Here, AsH$_3$ and TMGa were used as source gases at the time of growing GaAs, PH$_3$; TMIn, and TMGa were used as source gases at the time of growing InGaP; and TMIn, TMGa, and AsH$_3$ were used as source gases at the time of growing InGaAs. SiH$_4$ and DETe were used for doping of Si and Te, respectively. On the other hand, auto-doping by using TMGa was performed for doping of C. However, in addition to this, doping of C may be performed by using CCl$_4$, CBr$_4$, etc.

When growing up the ordered n-type InGaP collector layer 203, the growth temperature and the V/III ratio were optimized so that the ordering was fully obtained. Specifically, growth temperature was set to 670 degrees centigrade, and the V/III ratio was set to 200.

On the other hand, the n-type InGaP ledge layer 205 was grown at a growth temperature of 570 degrees centigrade and a V/III ratio of 200. At this growth temperature, indium (In) and gallium (Ga) in InGaP were arranged almost disorderly, and a periodicity of arrangement was almost not seen.

As explained above, after performing the crystal growth, the emitter mesa and base mesa were formed in the wafer using the usual phtolithography technique. Then, the collector electrode (AuGe/nickel/Au) 209, the base electrode (Pt/Ti/Au) 210, and the emitter electrode (Pt/Ti/Au) 211 were formed, and thus the transistor showed in FIG. 7 was formed.

The band structure of this transistor was also the one shown in FIG. 1. That is, by making the InGaP collector layer 203 in an ordered state, junction with the GaAs base layer 204 became of Type II, and an energy barrier at the interface has disappeared. On the other hand, in the emitter side, since the InGaP ledge layer 205 was formed into disordered state, an energy barrier existed in the conduction band.

Therefore, also in a transistor of this example, electrons in a non-equilibrium state pass through the base layer while keeping a high kinetic energy. According to this hot electron effect, base running time of electron was shortened compared with a case where there was no barrier at the side of the emitter, and much more high-speed operation was attained. The I–V characteristics of this transistor were similar to the one shown in FIG. 4.

Third Example

Next, a transistor which has a two-layered contact layer will be explained as a third example of the invention.

Figure 8:
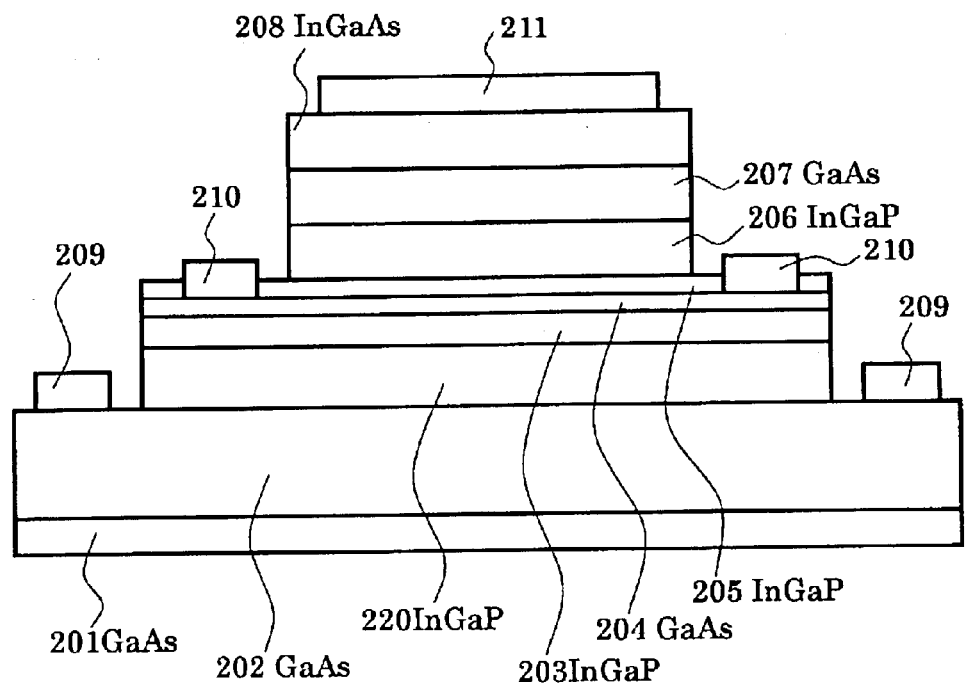
FIG. 8 is a schematic diagram showing principal part sectional structure of HBT of the example.

FIG. 8 is a schematic diagram showing principal part sectional structure of HBT of this example. The same symbols are given to the same elements as what were mentioned above about FIG. 7 about this figure, and detailed explanation is omitted.

That is, in HBT of this example, the second collector layer ($3 \times 10^{16}$ cm$^{-3}$ of Si doped, 400 nm of layer thickness) 220 which consists of non-ordered InGaP is provided between the n-type GaAs collector contact layer 202 and the n-type InGaP collector layer 203.

Growth of the second collector layer 220 was carried out at 570 degrees centigrade and a V/III ratio was set to 200. That is, InGaP which grown under this condition becomes in a mostly disordered state like the emitter layer 206. Such a disordered InGaP has a bandgap energy larger by about 0.05 eV-0.3 eV compared with ordered InGaP.

Figure 9:
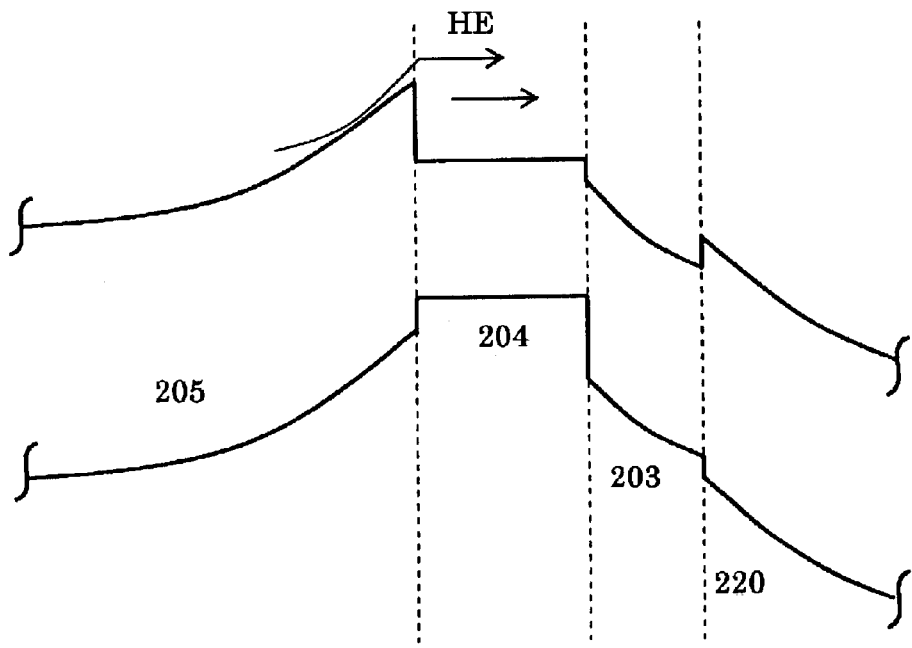
FIG. 9 is a schematic diagram showing band structure of HBT of the example.

FIG. 9 is a schematic diagram showing band structure of HBT of this example. As shown in this figure, the non-ordered InGaP second collector layer 220 has a larger bandgap energy compared with the ordered InGaP collector layer 203. As a result, a still larger collector breakdown voltage than the case of the HBT of the second example can be obtained.

According to this example, a saturation level of the collector current comparable to the second example, and a collector breakdown voltage larger by about 2 volts than a transistor of a second example were obtained.

Fourth Example

Next, an example of a transistor according to the second embodiment of the invention will be explained as a fourth example of the invention.

Figure 10:
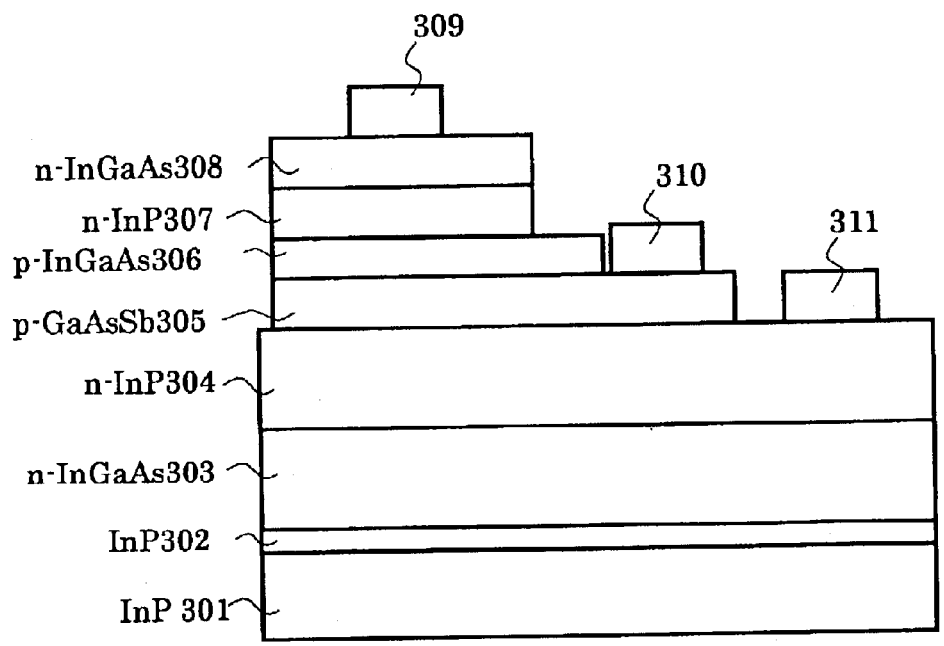
FIG. 10 is a schematic diagram showing principal part sectional structure of HBT of the example.

FIG. 10 is a schematic diagram showing principal part sectional structure of HBT of this example. That is, HBT of this example has a structure where the undoped InP buffer layer 302, the n-type InGaAs sub-collector layer 303, the n-type InP collector layer 304, the p-type GaAsSb second base layer 305, the p-type InGaAs first base layer 306, the n-type InP emitter layer 307, and the n-type InGaAs emitter contact layer 308 were laminated in this order, on the InP substrate 301.

The part of the laminated structure is removed, the collector electrode 311 is connected to the collector layer 304, the base electrode 310 is connected to the base layer 305, and emitter electrode 309 is connected to the emitter contact layer 308, respectively.

Hereafter, the structure of HBT of this example will be explained still in more detail according to the manufacture procedure.

Also in this example, crystal growth of the semiconductor layers was performed by the MOCVD method.

That is, the indium phosphide (InP) substrate 301 was first introduced into a reaction furnace of a MOCVD growth apparatus. And temperature of the reaction furnace was raised to 600 degrees centigrade, while flowing PH$_3$ into the reaction furnace in order to prevent dissociation of P atoms from the substrate by the heat. Then, PH$_3$ and TMIn were introduced into the furnace and the InP buffer layer 302 of about 300 nm was grown first.

Then, introduction of materials was interrupted, AsH$_3$, TMGa, and SiH$_4$ were introduced continuously, and Si doped n-type indium gallium arsenide (In$_{0.53}$Ga$_{0.47}$As) sub-collector layer 303 of 300 nm was grown. At this time, flux of SiH$_4$ was adjusted so that Si concentration in a sub-collector layer might be set to $2 \times 10^{19}$ (cm$^{-3}$), and flux of TMGa and TMIn was adjusted so that this layer might be in a lattice-matched condition with InP.

Then, again, in addition to $PH_3$ and TMIn, SiH4 was introduced in a furnace, and the Si dope n-type InP collector layer 304 of 200 nm was grown. At this time, flux of SiH4 was adjusted so that Si concentration in the collector layer 304 might be set to $3\times10^{16}$ $(cm^{-3})$.

After the growth of the collector layer 304, the temperature of the reaction furnace was lowered to 580 degrees centigrade, and after the temperature was stabilized, tertialbutylarsenic (TBAs), trimetylantimony (TMSb), TMGa, and carbon tetrabromide (CBr4) were introduced in the furnace, and the C-doped p-type GaAsSb second base layer 305 of 50 nm was grown. At this time, flux of $CBr_4$ was adjusted so that hole concentration in the second base layer might be set to $1\times10^{20}$ $(cm^{-3})$ Temperature of the reaction furnace was lowered to 450 more degrees centigrade after the growth of the second base layer 305, $AsH_3$, TMIn, triethylgallium (TEGa), and $CBr_4$ were introduced, and C-doped p-type InGaAs first base layer 306 of 20 nm was grown. At this time, flux of $CBr_4$ was adjusted so that hole concentration of a first base layer might be set to $5\times10^{19}$ $(cm^{-3})$. Further, the V/III ratio was set to 2. Quantity of source gas was adjusted so that Sb composition ratio in the group V elements of GaAsSb which constituted the second base layer 305 might be set to 0.6. Also, quantity of each source gas was adjusted so that In composition ratio in the group III elements of InGaAs which constituted the first base layer 306 might be set to 0.5.

After growth of the C dope p-type InGaAs first base layer 306, the temperature of the reaction furnace was raised to 560 degrees centigrade. Then, the Si-doped n-type InP emitter layer 307 of 50 nm was grown by introducing PH3, TMIn, and SiH4 into the furnace, and the Si-doped n-type $In_{0.53}Ga_{0.47}As$ emitter contact layer 308 of 50 nm was grown by introducign $AsH_3$, TMGa, TMIn, and $SiH_4$ into the furnace.

Then the wafer picked out from the MOCVD growth apparatus, and electrodes 309–311 were formed using a photolithography technique.

The HBT thus formed had the band structure as shown in FIG. 5. As shown in FIG. 5, since the emitter-base interface is InP/InGaAs, it turns into a hetero-interface of Type I. Since the base-collector interface is GaAsSb/InP, it turns into a hetero-interface of Type II.

Since InP which constitutes the collector layer 304 is a semiconductor with a comparatively wide bandgap, the thickness of the collector layer can be reduced while keeping a high breakdown voltage. In this way, a transistor which has high speed, a high breakdown voltage, and a high current profit was obtained. Specifically, a current gain was able to be improved to 27 with a transistor of this example, while the current gain having been 20 with a transistor in which a base layer was formed of a p-type GaAsSb layer whose thickness was 70 nm and the carrier concentration was $8\times10^{19}$ $(cm^{-3})$ without having the InGaAs first base layer 306.

In this example, base resistance can be notably lowered by having increased hole concentration of the second base layer 305 to $1\times10^{20}$ $(cm^{-3})$, and having increased hole concentration of the first base layer 306 to $5\times10^{19}$ $(cm^{-3})$. At the same time, discontinuous width of a conduction band of a heterojunction formed between these first and the first base layers 305 and 306 can be narrowed. As a result, electronic tunneling became remarkable, and a degradation of the device characteristic by the discontinuity of a conduction band has been controlled.

Fifth Example

Next, a second example of a transistor according to the second embodiment of the invention will be explained as a fifth example of the invention.

Figure 11:
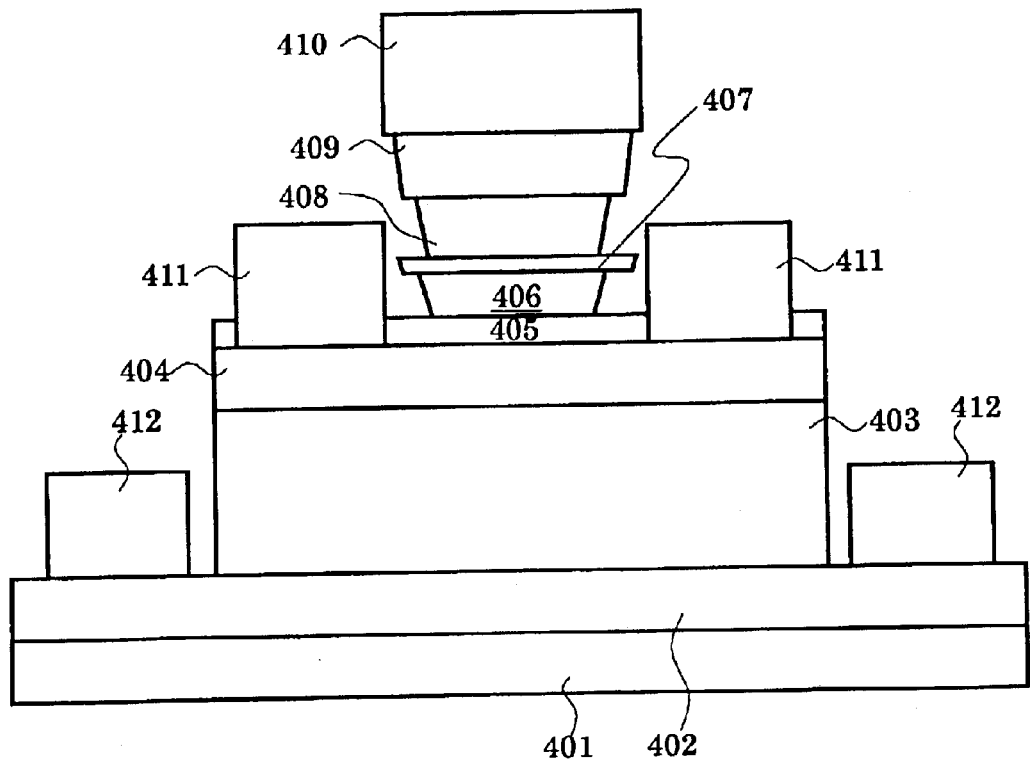
FIG. 11 is a schematic diagram showing principal part sectional structure of HBT of the example.
Figure 12:
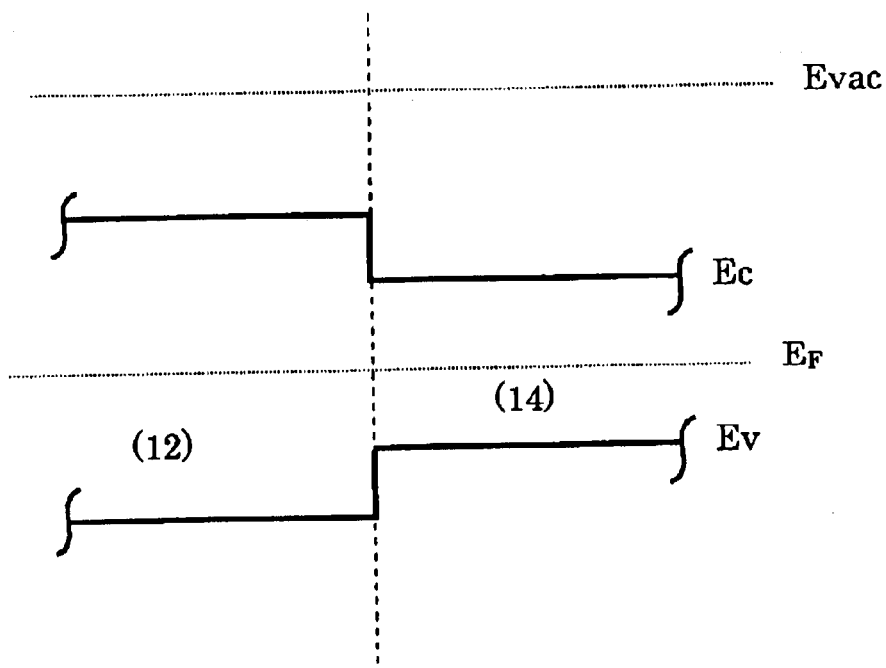
FIG. 12 is a band diagram showing a heterojunction of Type I.
Figure 13:
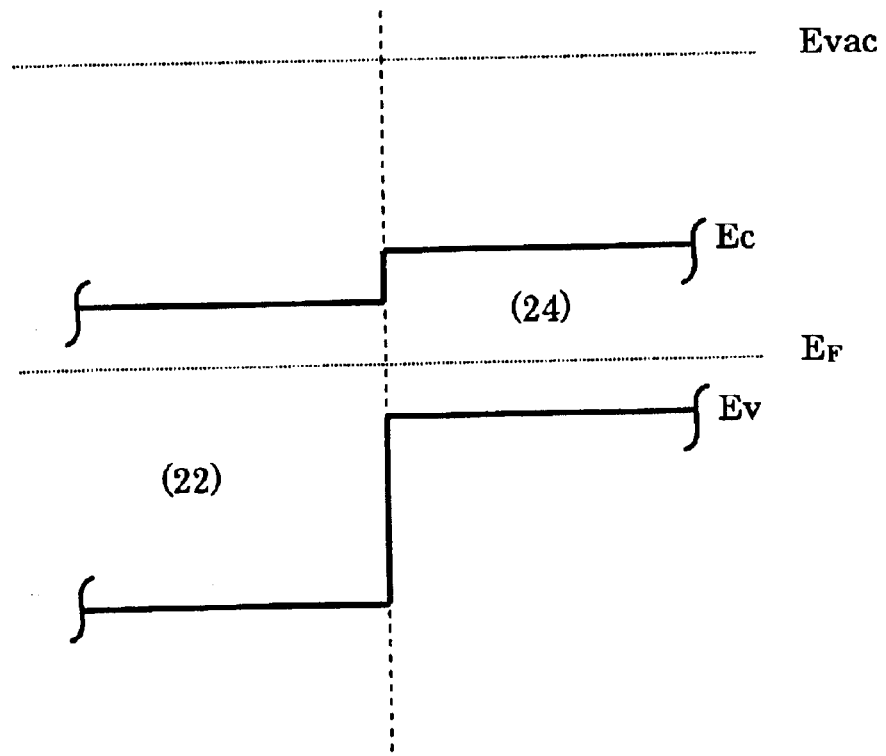
FIG. 13 is a band diagram showing a heterojunction of Type II.
Figure 14:
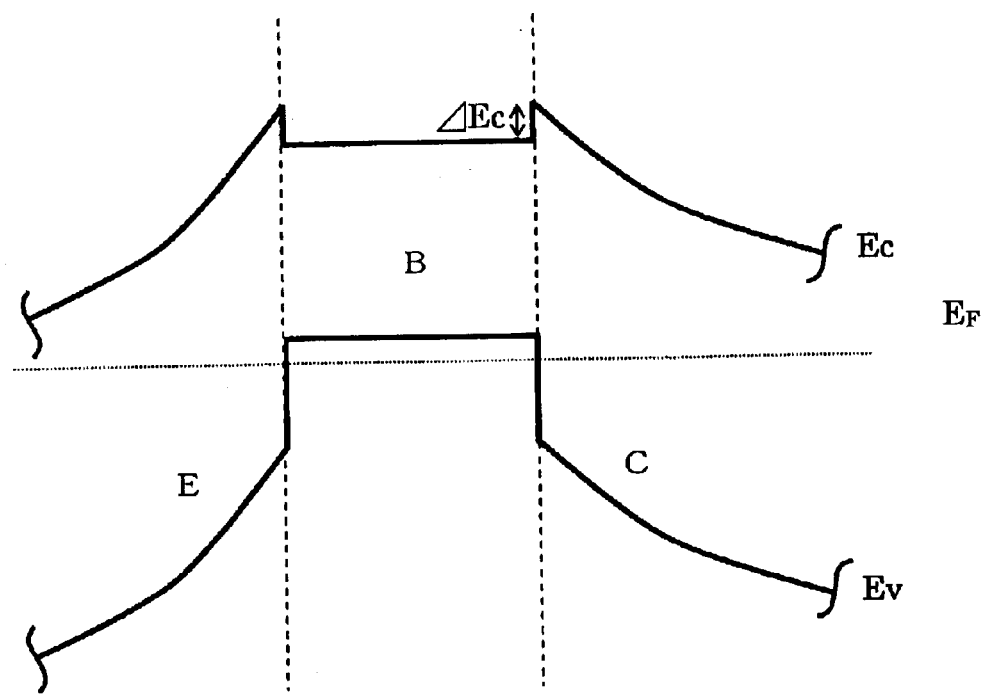
FIG. 14 is a band diagram of a principal part of DHBT that has been embodied for a trial by the Inventors of the present invention in the course of attempting to make the invention complete.

FIG. 11 is a schematic diagram showing principal part sectional structure of HBT of this example. That is, HBT of this example has a structure where the high-doped n-type InGaAs (Si-doped) collector contact layer 402, the low-doped n-type InP (Si dope) collector layer 403, the high-doped p-type GaAsSb (C dope) second base layer 404, the high-dope p-type InGaAs (C dope) first base layer 405, a n-type InP (Si dope) ledge layer 406, the n-type InGaAs (Si dope) etching stopper layer 407, the n-type InP (Si dope) emitter layer 408, and the high-doped n-type InGaAs (Te dope) emitter contact layer 409 are laminated in this order on the semi-insulating InP (Fe dope) substrate 401.

The part of the laminated sturcuture is removed, and the Ti/Au/Au collector electrode 312 is connected to the collector contact layer 402, the Pt/Ti/Pt/Au base electrode 411 is connected to the second base layer 404, and, the WSi emitter electrode 410 is connected to the emitter contact layer 409, respectively.

Hereafter, the structure of HBT of this example will be explained still in more detail according to the manufacture procedure.

Also in this example, crystal growth of the semiconductor layers was performed by the MOCVD method.

Namely, in this example, arsine ($AsH_3$) was used as As material, trimethylgallium (TMGa) was used as Ga material, phosphine ($PH_3$) was used as P material, Carbon tetrabromide ($CBr_4$) was used as C material, diethyltellurium (DETe) was used as Te material, silane ($SiH_4$) was used as Si material, and trimethylindium (TMIn) was used as In material. However, when growing a C-doped GaAsSb layer, tertialbuthylarsine (TBAs) was used as As material and trimethylantimony (TMSb) was used as Sb material.

First, reaction furnace temperature was raised up to 650 degrees centigrade, then, the collector contact In0.5Ga0.5As layer 402 of the carrier concentration of $3\times10^{19}$ $(cm^{-3})$ and a thickness of 200 nm, and the InP collector layer 403 of a thickness of 200 nm and the carrier concentration of $1\times10^{16}$ $(cm^{-3})$ were grown on the Fe-doped semi-insulating InP substrate 401.

Then, temperature of the reaction furnace was lowered to 520 degrees centigrade, and the second base GaAsSb layer 404 of the carrier concentration of $8\times10^{19}$ $(cm^{-3})$ and a thickness of 10 nm, and the second base InGaAs layer 405 of 30 nm and the carrier concentration of $2\times10^{19}$ $(cm^{-3})$ were grown. Here, the composition ratio $X_{Sb}$ of Sb of the second base layer was set to 0.55, and In composition ratio $X_{In}$ of the first base layer was set to 0.45.

Then, the ledge InP layer 406 of 25 nm and the carrier concentration of $3\times10^{17}$ $(cm^{-3})$, and the $In_{0.5}Ga_{0.5}As$ etching stopper layer 407 of 7 nm and the carrier concentration of $2\times10^{18}$ $(cm^{-3})$ were grown.

Then, temperature of the reaction furnace was lowered to 500 degrees centigrade, and the InP emitter layer 408 of 50 nm and of the carrier concentration of $5\times10^{18}$ $(cm^{-3})$ and the $In_{0.5}Ga_{0.5}As$ emitter contact layer 409 of 100 nm and of a carrier concentration of $3\times10^{19}$ $(cm^{-3})$ were grown.

Next, the wafer was put into an electrode process.

First, the emitter electrode 410 was formed on an emitter area by using WSi by sputtering and a photolithography technique. A base formation area was formed by wet etching by using this emitter electrode 410 as a mask. Here, an InGaAs layers of the emitter contact layer 409 and the annealing protection layer 407 which acts as a etching stopper layer were etched using a mixed-solution of $H_2O_2:H_3PO_4:H_2O$, and InP layers of the first emitter layer 406 and the second emitter layer 408 were etched using a HCl:H$_2$O mixed-solution.

Since there was a first base layer 405, selective etching was easy and the under cut of an emitter area was formed easily when the first emitter layer 406 is etched. In the emitter area, the first base layer of an area on which the base electrode was to be formed was removed using a mixed-solution of H$_2$O$_2$:H$_3$PO$_4$:H$_2$O. Then, vacuum deposition of Pt/Ti/Pt/Au was performed by using the emitter electrode 410 as a mask and by using mask made by lithography, and the base electrode 411 was formed.

In this example, although an electrode was formed on the second base layer 404, an electrode may be formed on the first base layer 405. However, since a high-doping is possible for the second base layer 404 made of GaAsSb, when the size of contact resistance is taken into the consideration, it is desirable to form an electrode on the second base layer 404.

Then, a collector isolation area was formed by lithography etching. Etching of the InGaAs first base layer 405 and the GaAsSb second base layer 404 were performed by using a mixed-solution of H$_2$O$_2$:H$_3$PO$_4$:H$_2$O, and the etching InP of the collector layer 403 was performed by using a HCl:H$_2$O mixed-solution. Then, vacuum depositions of Ti/Pt/Au were made one by one on the collector contact layer 402, and the collector electrode 412 was formed with a lithography technique.

Thus, when DC measurement of the formed HBT was made, about 80 was obtained as a current gain β when the sheet resistance RB of the base equals to 1000 ohms/□. This is a value lager by 50% or more than conventional DHBT having the InGaAs base, and even if it is compared with HBT of a GaAsSb base, it is compatible.

This result shows that in HBT of the example, although a discontinuity is formed in a conduction band at a hetero-interface of the second base layer 404 and the first base layer 405, most electrons tunnel the discontinuity and a fall of a current gain did not occur since high-doping more than 1×10$^{19}$ (cm$^{-3}$) was made for each layer, as mentioned above with reference to FIG. 5.

The breakdown voltage BVCEO of the transistor was as high as 7 volts or more, and thus, an effect of double-heterojunction structure was obtained. As shown in FIG. 5, since there was no barrier over an electron between emitter-base unlike HBT (FIG. 16) using GaAsSb, a saturation current value of collector current has been improved, and current density per unit area rose.

That is, according to this example, while keeping the output equivalent to the former, miniaturization rather than the conventional HBT can be possible, and high integration of power amplifier (PA) etc. is attained.

Next, a result of having made RF measurement of the HBT of this example will be explained. Here, emitter size was set to 2 μm×10 μm. The maximum gain cutoff frequency f$_T$ was about 90 GHz, and a high value of 150 GHz in the maximum frequency f$_{MAX}$ was acquired. This is the outstanding data exceeding the former HBT.

As compared with the former GaAsSb base, about 8% of improvement was confirmed also about a fabrication yield. In particular, in the case of conventional HBT, a problem that all transistors in a lot become out of spec. by poor etching was often seen. On the other hand, such an annihilation can be canceled by applying the invention.

Heretofore, the embodiments of the invention have been described by way of example, and it should be understood that the present invention is not limited to these examples.

Dimensions, shapes, conductivity types, impurity concentrations, materials, etc. of components in each of the examples include not only those set forth herein but also those which are well known to and selectively recognized by any person having ordinary skills in the art as having similar effects to those taught herein in relation with the embodiments of the invention.

Thus, the embodiments of the present invention ensure and facilitate production of the high performance heterojunction bipolar transistor, and it offers a large amount of benefit in this point to the industry.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A heterojunction bipolar transistor comprising,
   an emitter made of a first compound semiconductor of a first conductivity type;
   a base made of a second compound semiconductor of a second conductivity type and having a bandgap smaller than the first compound semiconductor; and
   a collector made of a third compound semiconductor of a first conductivity type and having a bandgap wider than the second compound semiconductor,
   the emitter and the base forming a heterojunction of type I,
   the base and the collector forming a heterojunction of type II, and
   the base including impurities by a concentration equal to or more than 5×10$^{19}$ cm$^{-3}$.

2. A heterojunction bipolar transistor according to claim 1, wherein the first compound semiconductor is In$_{1-x}$Ga$_x$P, the second compound semiconductor is GaAs, and the third compound semiconductor is In$_{1-x}$Ga$_x$P.

3. A heterojunction bipolar transistor according to claim 1, further comprising a second collector adjoining the collector on an opposite side from the base and made of a fourth compound semiconductor of a first conductivity type,
   the fourth compound semiconductor having a bandgap wider than the third compound semiconductor.

4. A heterojunction bipolar transistor according to claim 3, wherein the fourth compound semiconductor includes a plurality of kinds of group III elements, and
   an orderliness of the plurality of kinds of group III elements in the third compound semiconductor is higher than an orderliness of the plurality of kinds of group III elements in the fourth compound semiconductor.

5. A heterojunction bipolar transistor comprising,
   an emitter made of a first compound semiconductor of a first conductivity type;
   a base made of a second compound semiconductor of a second conductivity type and having a bandgap smaller than the first compound semiconductor; and
   a collector made of a third compound semiconductor of a first conductivity type and having a bandgap wider than the second compound semiconductor,
   each of the first and third compound semiconductors includes a plurality of kinds of group III elements, and an orderliness of the plurality of kinds of group III elements in the third compound semiconductor is higher than an orderliness of the plurality of kinds of group III elements in the first compound semiconductor.

6. A heterojunction bipolar transistor according to claim 5, wherein the emitter and the base forms a heterojunction of type I, and the base and the collector forms a heterojunction of type II.

7. A heterojunction bipolar transistor according to claim 5, wherein the first compound semiconductor is $In_{1-x}Ga_xP$, the second compound semiconductor is GaAs, and the third compound semiconductor is $In_{1-x}Ga_xP$.

8. A heterojunction bipolar transistor according to claim 5, further comprising a second collector adjoining the collector on an opposite side from the base and made of a fourth compound semiconductor of a first conductivity type, the fourth compound semiconductor having a bandgap wider than the third compound semiconductor.

9. A heterojunction bipolar transistor according to claim 8, wherein the fourth compound semiconductor includes a plurality of kinds of group III elements, and an orderliness of the plurality of kinds of group III elements in the third compound semiconductor is higher than an orderliness of the plurality of kinds of group III elements in the fourth compound semiconductor.

10. A heterojunction bipolar transistor comprising, an emitter made of a first compound semiconductor of a first conductivity type;

a first base made of a second compound semiconductor of a second conductivity type and having a bandgap smaller than the first compound semiconductor;

a second base made of a third compound semiconductor of a second conductivity type and having a bandgap smaller than the first compound semiconductor; and a collector made of a fourth compound semiconductor of a first conductivity type and having a bandgap wider than the third compound semiconductor, the third compound semiconductor having a composition that differs from a composition of the second compound semiconductor, the emitter and the first base forming a heterojunction of type I, and the second base and the collector forming a heterojunction of type II.

11. A heterojunction bipolar transistor according to claim 10, wherein the second and the third compound semiconductors have impurity concentrations equal to or higher than $5 \times 10^{19}$ cm$^{-3}$.

12. A heterojunction bipolar transistor according to claim 10, wherein the second compound semiconductor is InGaAs, and the third compound semiconductor is GaAsSb.

13. A heterojunction bipolar transistor according to claim 10, wherein the first and the fourth compound semiconductors are InP.

14. A heterojunction bipolar transistor according to claim 3, wherein the fourth compound semiconductor includes a plurality of kinds of group III elements, and an orderliness of the plurality of kinds of group III elements in the third compound semiconductor is higher than an orderliness of the plurality of kinds of group III elements in the fourth compound semiconductor.

* * * * *